US 10,340,558 B2

(12) United States Patent
Hellenthal et al.

(10) Patent No.: US 10,340,558 B2
(45) Date of Patent: Jul. 2, 2019

(54) BATTERY CELL WITH MONITORING DEVICE, AND CORRESPONDING OPERATING METHOD

(71) Applicant: AUDI AG, Ingolstadt (DE)

(72) Inventors: Berthold Hellenthal, Schwanstetten (DE); Michael Hinterberger, Großmehring (DE)

(73) Assignee: AUDI AG, Ingolstadt (DE)

( * ) Notice: Subject to any disclaimer, the term of this patent is extended or adjusted under 35 U.S.C. 154(b) by 91 days.

(21) Appl. No.: 15/550,545

(22) PCT Filed: Feb. 12, 2016

(86) PCT No.: PCT/EP2016/053063
§ 371 (c)(1),
(2) Date: Aug. 11, 2017

(87) PCT Pub. No.: WO2016/131729
PCT Pub. Date: Aug. 25, 2016

(65) Prior Publication Data
US 2018/0040924 A1    Feb. 8, 2018

(30) Foreign Application Priority Data
Feb. 18, 2015   (DE) .................. 10 2015 002 071

(51) Int. Cl.
*H02J 7/00*     (2006.01)
*H01M 10/42*    (2006.01)
(Continued)

(52) U.S. Cl.
CPC ......... *H01M 10/4264* (2013.01); *B60L 50/15* (2019.02); *B60L 58/10* (2019.02);
(Continued)

(58) Field of Classification Search
USPC ................... 324/433–436; 320/112, 164
See application file for complete search history.

(56) References Cited

U.S. PATENT DOCUMENTS 5,606,242 A    2/1997    Hull et al.
6,157,170 A    12/2000   Noda et al.
(Continued)

FOREIGN PATENT DOCUMENTS

CN    1163020 A    10/1997
CN    1245900 A    3/2000
(Continued)

OTHER PUBLICATIONS

Notification of Transmittal of Translation of the International Preliminary Report on Patentability dated Aug. 31, 2017, in connection with corresponding international application No. PCT/EP2016/053063 (9 pages).

(Continued)

*Primary Examiner* — Vincent Q Nguyen
(74) *Attorney, Agent, or Firm* — Maier & Maier, PLLC

(57) ABSTRACT

A battery cell with a monitoring device including a data processing unit for processing state data of the battery cell as a function of a trigger pulse and a triggering unit, which is connected to the data processing unit, to generate the trigger pulse and to provide the trigger pulse to the data processing unit. The triggering unit is designed to evaluate a measurement signal, which correlates with an electrical energy of the battery cell in order to generate the trigger pulse as a function of the measurement signal. The invention further relates to a battery having such a battery cell as well as to a motor vehicle having such a battery. Furthermore, the invention relates to a method for monitoring at least one such battery cell.

5 Claims, 4 Drawing Sheets

(51) Int. Cl.
  *G01R 31/364* (2019.01)
  *G01R 31/3832* (2019.01)
  *H04Q 9/00* (2006.01)
  *B60L 50/15* (2019.01)
  *B60L 58/10* (2019.01)
  *G01R 19/165* (2006.01)
  *G01R 31/382* (2019.01)
  *H01M 10/052* (2010.01)

(52) U.S. Cl.
  CPC ..... *G01R 19/16542* (2013.01); *G01R 31/364* (2019.01); *G01R 31/382* (2019.01); *G01R 31/3833* (2019.01); *H04Q 9/00* (2013.01); *B60L 2240/547* (2013.01); *B60L 2240/549* (2013.01); *H01M 10/052* (2013.01); *H01M 2010/4278* (2013.01); *H01M 2220/20* (2013.01); *Y02E 60/122* (2013.01); *Y02T 10/7005* (2013.01); *Y02T 10/705* (2013.01)

(56) References Cited

U.S. PATENT DOCUMENTS

| | | | |
|---|---|---|---|
| 6,285,164 | B1 | 9/2001 | Noda et al. |
| 8,332,945 | B2 | 12/2012 | Kim et al. |
| 9,035,623 | B1 * | 5/2015 | Berkowitz ............ H02J 7/0077 320/112 |
| 2013/0106429 | A1 | 5/2013 | Krause |
| 2014/0184314 | A1 | 7/2014 | Takahashi et al. |
| 2014/0229129 | A1 | 8/2014 | Campbell et al. |

FOREIGN PATENT DOCUMENTS

| | | |
|---|---|---|
| CN | 101490937 A | 7/2009 |
| DE | 2656148 A1 | 6/1977 |
| DE | 3702591 A1 | 8/1988 |
| EP | 1037065 B1 | 9/2004 |
| EP | 2043244 A1 | 4/2009 |
| EP | 2385604 A1 | 11/2011 |
| GB | 1562717 A | 3/1980 |

OTHER PUBLICATIONS

Examination Report dated Jan. 8, 2016 of corresponding German application No. 102015002071.4; 6 pgs.

International Search Report dated May 24, 2016 of corresponding International application No. PCT/EP2016/053063; 18 pgs.

Chinese Office Action dated Dec. 29, 2019, in connection with corresponding CN Application No. 201680010756.1 (12 pgs., including machine-generated English translation).

* cited by examiner

BATTERY CELL WITH MONITORING DEVICE, AND CORRESPONDING OPERATING METHOD

FIELD

The invention relates to a battery cell for a battery, particularly of a motor vehicle. In addition, the invention relates to a battery having at least one such battery cell as well as to a motor vehicle having such a battery. Furthermore, the invention relates to a method for monitoring at least one battery cell.

BACKGROUND

Lithium-ion batteries or lithium-ion battery systems have become established in practically all areas of mobile energy storage devices due to their high energy density and power density, regardless of whether they involve pedelecs, power tools, hybrid drives, electric vehicles, or even railway applications. At the same time, lithium-ion battery systems are becoming increasingly more important for stationery battery storage systems. A flat state of charge/voltage characteristic curve is characteristic of many lithium-ion cells or the cell chemistry thereof. In the marginal areas of less than about 10% and greater than 90% state of charge (SoC), the voltage level of the battery cells, however, changes very quickly. Over time, the battery cells can possibly drift apart from one another in their voltage level. This can occur through various effects such as, for example, various self-discharging rates, non-homogenous temperatures during operation, or even premature aging of a few cells in a battery system, or even due to different batches (supplied from different production batches).

In order to be able to evaluate the risk of a potential failure of a battery cell in advance, it is useful to detect or record state data from the ongoing operation of each battery cell and to document it for subsequent evaluation. This data includes, particularly, the temperatures of the cell that occur during operation, as well as the progression of charge and/or discharge currents and the corresponding states of charge. Storing data records at equal time intervals is known from the prior art. In the simplest case, this can be initiated through a clock generator, which initiates the storing of a data record at equal time intervals by creating a corresponding trigger signal. If a real time clock (RTC) is also available, the data record can also be equipped with a time-stamp or date-stamp. With storage at short time intervals, very large quantities of data can accrue. However, if the time interval between two storage processes is increased, this results in the risk that essential events will not be detected or recorded for evaluating a battery cell state.

SUMMARY OF THE DISCLOSURE

Thus, the object of the present invention is to provide a battery cell, a battery having at least one such battery cell, a motor vehicle having such a battery, as well as a method for monitoring at least one battery cell, by way of which an improved processing of state data of the battery cell is made possible.

The battery cell according to the invention comprises a monitoring device, which comprises a data processing unit for processing state data of the battery cell as a function of a trigger pulse and a triggering unit. The triggering unit is connected to the data processing unit and is designed to generate the trigger pulse and provide said trigger pulse to the data processing unit. In doing so, the triggering unit is designed to evaluate a measurement signal, which correlates with the electrical energy of the battery cell in order to generate the trigger pulse as a function of the measurement signal. The data processing unit may particularly involve a microcontroller or a microprocessor. State data may be provided by corresponding sensors of the battery cell. Thus, for example, a voltage of the battery cell, a temperature, a pressure, an impedance of the battery cell, or even a spatial position, or an acceleration of the battery cell can be stored. When a correspondingly suitable measurement sensor is available, any parameter of the battery cell or of the environment can be detected or recorded. A provision here may also be that the data processing unit receives further data, which are not determined directly within the battery cell, via an additional—preferably wireless—communication link.

The finding upon which the invention is based is that an especially beneficial relationship between the data quantity to be stored and coverage of relevant events can be achieved when a storage process is executed as a function of the electrical energy in the battery cell. Thus, storage intervals can be extended, for example, when the battery cell is not being supplied or drained of electrical energy. Likewise, there may be a provision to provide detailed documentation of the state data in the region of a high state of charge, that is, when approaching the voltage of the battery cell at an end-of-charge voltage depending on the type of battery cell, or when approaching a low state of charge with a potentially occurring total discharge.

In an advantageous enhancement, the triggering unit is designed to generate the trigger pulse at a first point in time at which the battery cell has a first electrical energy content and to generate the trigger pulse at a second point in time at which the battery cell has a second electrical energy content, whereby the first electrical energy content and the second electrical energy content differ by a pre-definable energy value. The entire range of an energy hub of the battery cell is thereby covered uniformly between the end-of-charge limit and the end-of-discharge limit based on an energy unit (EE), for example a watt second or a kilowatt hour. This means that gapless documentation of a complete charge/discharge cycle is possible. Depending on the electrical energy of the battery cell, which corresponds to a state of charge of the battery cell, state information regarding the battery cell is recorded and displayed. Based on a suitable energy measurement, the flow of energy into and out of the battery cell is totaled. If an energy unit flows into the battery cell or flows out of the battery cell, the state information of the battery cell, for example voltage, temperature, pressure, impedance, spatial position, acceleration, and the like, is stored. This can take place, for example, with an intelligent battery cell (SmartCell) with integrated storage device and integrated sensors by means of an integrated intelligent control in the form of a microcontroller or an automated state unit. If the intelligent battery cell can communicate externally with an external device, it can prompt said device for time information and store this information along with the data record. This may be possible with a motor vehicle, particularly during the charging and in the driving operation. If a GPS position is available from the external device as well, this can also be stored along with the data record. Based on the principle of energy-unit-based storage of state data, a relevant energy history of the battery cell can be documented in an energy-efficient manner. In particular, the energy history of the battery cell can thereby be completely documented.

For efficient data storage, a provision may also be to reduce the quantity of state data to be stored in that input only takes place when there is a change; this means that a running value of a parameter is not stored when the running value has not changed with respect to the most recently stored value. In particular, if none of the state data to be recorded has changed since the last storage process, this data is not stored but only the energy unit value is modified. This leads to, particularly during charging, a low data volume in the case of the high energy unit change rate associated with charging. The storage entry in this case consists only of the (modified) energy unit value.

In a preferred enhancement, the measurement signal is proportional to an electric current through the battery cell or proportional to an electrical power of the battery cell, in which the triggering unit has means to generate an integration signal as a function of the measurement signal, and when the integration signal falls below or exceeds a pre-definable threshold value, is designed to generate the trigger pulse and to reset the integration signal to a start. It is especially advantageous here when the measurement signal represents the electrical current through the battery cell, because the measurement signal in this case can be particularly easily obtained with the technical means already existing in the battery cell. A correlation with the electrical power of the battery cell results from multiplying by the electrical voltage in the battery cell. With reference to the electric current through the battery cell, the pre-definable energy value must thus be interpreted as the charge value. As previously shown at the beginning, with lithium-ion cells having a state of charge ranging from about 10% to 90%, there is a flat progression of the voltage in the cell. Thus, in this range, an energy value and a charge value are linked to one another by means of an approximately constant factor, namely the voltage in the battery cell. The invention is thus usable in an unlimited manner with both variants for providing the measurement value.

With an integration of the measurement signal, it is transitioned into an integration signal, which, depending on the type of the measurement signal provided, represents an electrical charge or an electrical energy. In this process, it is particularly important for the measurement signal to be offset-free; this means that it takes on the value of 0, even if the physical variable upon which it is based, that is an electrical power or an electric current, takes on the value of 0. By means of testing the integration signal for exceeding or going below the pre-definable threshold value, the point of time can thus be determined at which the pre-definable quantity of energy or charge quantity was implemented as compared to a point in time of the most recently generated trigger pulse. In this manner, a sequence of trigger pulses can be created, which divides the transferred energy or charge into respectively equal energy units or charge units. Any charge/discharge cycle of the battery cell is thereby completely documented with a pre-definable resolution, which depends on the energy unit or charge unit. Depending on the specified resolution and the level of the measurement signal, an interval between two trigger pulses can result in this case that is between fractions of seconds of up to hours or days. In doing so, there may be a provision to specify an upper limit for a time interval between the two sequential trigger pulses, whereby, upon reaching said upper limit, a processing of the state data and storage takes place without the pre-definable threshold value having been reached by the integration signal.

In another preferred embodiment, the triggering unit has a first capacitor, which is electrically connected to a first analog input of the data processing unit as well as to a first comparator unit as a means for generating the integration signal, in which the integration signal can be provided to the first capacitor by a first electric voltage, and the comparator unit is designed to generate the trigger pulse upon the exceeding of a pre-definable first threshold value by the first electric voltage at the first capacitor. This results in an especially simple and energy-saving design of the invention. The provision of the measurement signal here appropriately takes place by way of an electric current. The components intended to generate the trigger pulse consume little energy and place the data processing unit with each trigger pulse only briefly in operation, namely as long as the unit needs for processing the state data and in order to reset the capacitor back to the start value.

In an advantageous enhancement, the first capacitor is electrically connected to a first bidirectional connection terminal of the data processing unit via a first resistor. The term "resistor" here is understood to mean a resistance element that is a passive structural element and not a resistance value. The first bidirectional connection terminal is designed to take on one of the three following states: Low level with an electrically conductive connection to a reference potential of the data processing unit, high level with an electrically conductive connection to a supply potential of the data processing unit, in which a supply voltage of the processing unit is present between the supply potential and the reference potential, or nonexistence of a conductive connection. The first capacitor can thereby be reset back to the start value by the data processing unit within a brief period of time after exceeding or falling below the pre-definable threshold value. After the reset to the start value, the first bidirectional connection terminal is reset to a high resistance state such that the first capacitor is no longer loaded. Preferably, the data processing unit can subsequently be placed in a standby state in which energy consumption is reduced to a minimum. In this manner, the energy consumption can be kept especially low by the monitoring device and thus a low self-discharging of the battery cell can be achieved.

In another advantageous design, the triggering unit has a second capacitor, which is electrically connected to a second bidirectional connection terminal of the data processing unit by means of a second resistor and is electrically connected to a second analog input of the data processing unit, as well as to a second comparator unit. In doing so, a reference signal can be provided to the second capacitor by a second electric voltage. The comparator unit here is designed to generate the trigger pulse by means of the second electric voltage when a pre-definable second threshold value is exceeded. The triggering unit has a common current source with a pre-definable constant current, which is designed to impose a compensating current to compensate for self-discharging currents of the first capacitor and of the second capacitor. There may also be a provision here for the current source to be configurable by means of the data processing unit. Preferably, the second capacitor has the same capacitance as the first capacitor. In addition, a provision may be to control the distribution of the pre-definable constant current to the first capacitor and the second capacitor by means of a third resistor and a fourth resistor, respectively. In particular, a provision may be that the resistance value of the third resistor and the resistance value of the fourth resistor are equal such that the constant current is evenly distributed to the first capacitor and the second capacitor. This arrangement enables compensation of a self-discharging current of the first capacitor. The second capacitor here serves as a reference capacitor to check that the constant current provided from the current source precisely covers the self-discharging current of the first capacitor.

In an advantageous enhancement, the triggering unit is designed to reset the second electric voltage to a differential state and to supply an equalization charge quantity to be put in the second capacitor in the first capacitor as well when the pre-definable second threshold value is exceeded by the second electric voltage. In the event that the constant current provided by the common current source does not precisely cover the self-discharging of the first capacitor and of the second capacitor, namely supplies insufficient or excessive current, the lacking or excessive charge quantity can be obtained by means of the second capacitor and said quantity supplied to or drained from both capacitors concordantly, this means supplied to or drained from the first capacitor and the second capacitor such that the second capacitor will be back at its reference state after said compensating process. This means that a sustainably correct measurement of the energy units or the charge units is possible by means of the first capacitor over a longer timeframe as well.

The invention also includes a battery with at least one battery cell of the type according to the invention. The battery according to the invention comprises a plurality of battery cells according to the invention, which may be connected in series and/or in parallel. A provision here may be that the measuring signal represents the electrical energy, which correlates with the entirety of the battery cells connected to one another.

The motor vehicle according to the invention comprises at least one battery according to the invention. The motor vehicle may be designed, for example, as a passenger car, particularly as an electric vehicle or hybrid vehicle. Furthermore, the motor vehicle may also be an electrically driven motorcycle or an electrically driven bicycle.

However, it is also possible to provide the battery in a stationary energy storage system. Moreover, there may be a provision that the battery, which was provided in a motor vehicle, is to be reused as a so-called second life battery, in which the battery is thus supplied for a different type of use. Particularly with second life applications, namely the requirements, for example, for performance of the battery cells may be less than with the use of the battery cells for the battery of a motor vehicle. In this case, the status data present in the battery cell from the past operating time of the battery cell can be used advantageously for selection and testing.

On the process side, at least one battery cell is proposed for monitoring the following steps: Processing of status data of the battery cell as a function of a trigger pulse, evaluation of a measurement signal, which correlates to electrical energy of the battery cell, generation of the trigger pulse as a function of the measurement signal, and provision of the trigger pulse.

The advantages described for the battery cell according to the invention and preferred embodiments also apply to the battery according to the invention and to the motor vehicle according to the invention.

Likewise, the advantages and features described for the devices according to the invention as well as the embodiments apply equally to corresponding methods and vice versa. Consequently, corresponding process features may be provided for device features and vice versa.

BRIEF DESCRIPTION OF THE DRAWINGS

The features and feature combinations listed previously in the description as well as the features and feature combinations listed in the figure description and/or in the figures alone in the following can be used not only in the respectively indicated combination, but also in other combinations, or in isolation, without going beyond the scope of the invention. Thus, there are also embodiments that are to be considered comprised and disclosed by the invention, which are not explicitly shown and explained in the figures, but are emphasized and can be created through separate feature combinations from the explained embodiments.

Additional advantages, features, and details of the invention result from the claims, the following description of the preferred embodiments, as well as the drawings: The following is shown:

DETAILED DESCRIPTION OF THE DRAWINGS

Figure 1:
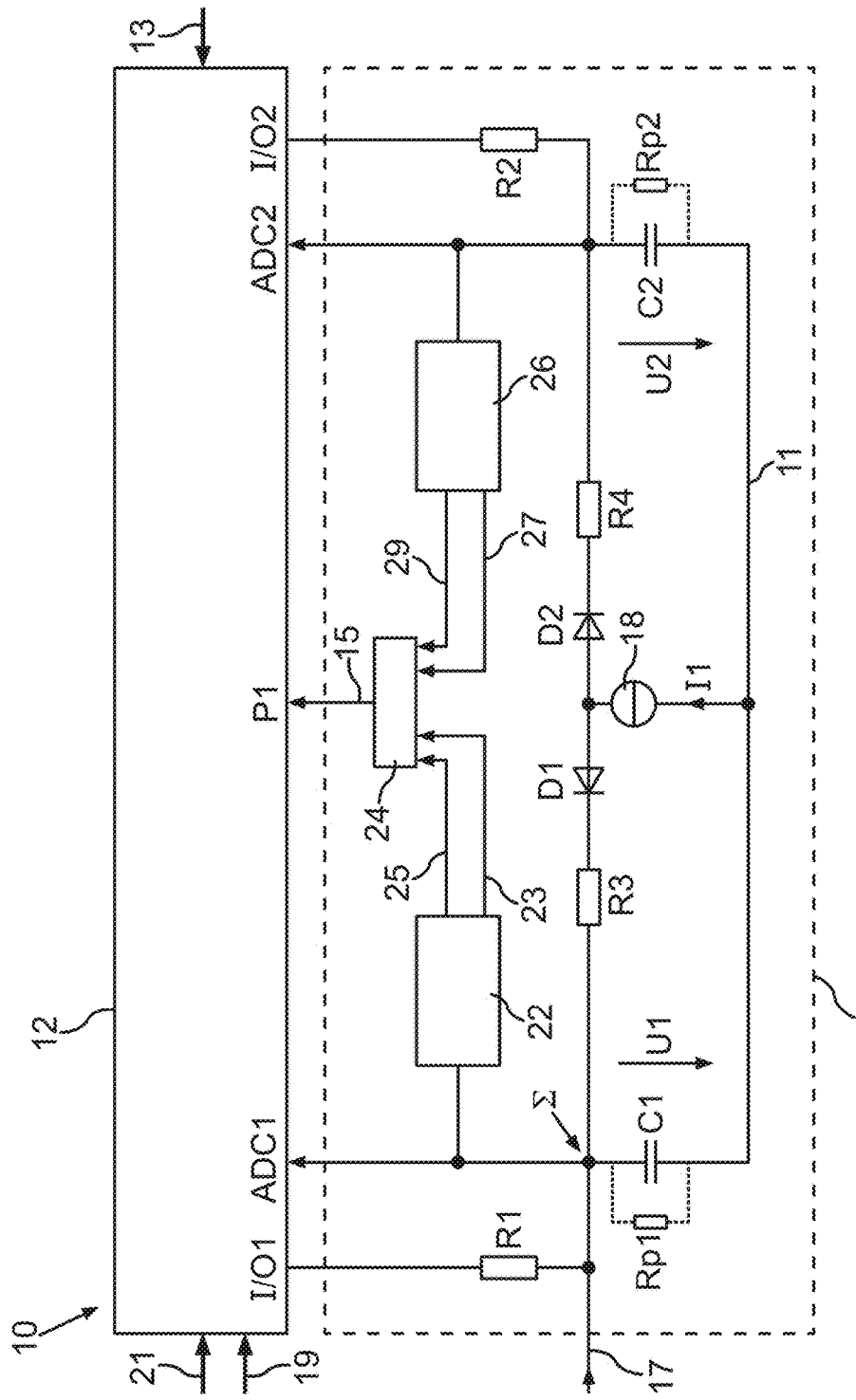
FIG. 1 shows a schematic representation of an embodiment of a monitoring device of a battery cell in a simplified schematic representation.

FIG. 1 schematically shows a monitoring device 10, as can be used in a battery cell. The monitoring device 10 comprises a data processing unit 12, which is connected to a triggering unit 14. Status data 13 is provided to the data processing unit 12 by sensors in or outside of the battery cell. The triggering unit 14 provides a trigger pulse 15 to an input P1 of the data processing unit 12. This may be an input P1, which enables a so-called wake-up of the data processing unit 12. A measurement signal, which is preferably proportional to an electric current through the battery cell, is supplied as a current signal 17 in a branching point Σ of the triggering unit 14. Additional data can be queried by the data processing unit 12 of an external data source, for example a real-time clock 19 (RTC) or a locating signal 21, for example in the form of a GPS signal (global positioning system).

The triggering unit 14 has a symmetrical arrangement of components. A first capacitor C1, at which a first voltage U1 is present, serves as a measuring capacitor, a second capacitor C2, at which a second voltage U2 is present, serves as a reference capacitor. Both capacitors C1, C2 are based on a common reference potential 11. A first parallel resistor Rp1, which represents a self-discharging of the first capacitor C1, is indicated parallel to the first capacitor C1. In the same manner, a second parallel resistor Rp2, which stands for a self-discharging of the second capacitor C2, is indicated parallel to the second capacitor C2. In order to compensate for the self-discharging by means of the first parallel resistor Rp1 and the second parallel resistor Rp2, a constant current source 18 is provided, which supplies a constant current I1. The constant current I1 is distributed over a first diode D1 and a second diode D2, in which the anodes of the two diodes, D1 and D2, are connected to the constant current source 18. A connection terminal, which is not connected to the reference potential 11, of the first capacitor C1, which is characterized in the following as the upper connection terminal of the first capacitor C1, is connected to a first bidirectional connection terminal I/O1 of the data processing unit 12 by means of a first resistor R1. In the same manner, a connection terminal, which is not connected to the reference potential 11, of the second capacitor C2, which is characterized in the following as the upper connection terminal of the second capacitor C2, is connected to a second bidirectional connection terminal I/O2 of the data processing unit 12 by means of a second resistor R2. The upper connection terminal of the first capacitor C1 is furthermore electrically connected to a first analog input ADC1 of the data processing unit 12 as well as to an input of a first comparator unit 22. Likewise, the upper connection terminal of the second capacitor C2 is connected to a second analog input ADC2 of the data processing unit 12 as well as to an input of the second comparator unit 26.

The cathode of the first diode D1 Is connected to the upper connection terminal of the first capacitor C1 by means of a third resistor R3. In the same manner, the cathode of the second diode D2 is connected to the upper connection terminal of the second capacitor C2 by means of a fourth resistor R4. The first comparator unit 22 provides a signal 23, which indicates a falling below a pre-definable lower threshold value as well as a signal 25, which indicates an exceeding of a pre-definable upper threshold value. In the same manner, the second comparator unit 26 provides a signal 27, which indicates a falling below a pre-definable lower threshold value as well as a signal 29, which indicates an exceeding of a pre-definable upper threshold value. Preferably, the upper and the lower threshold values here can be specified identically for both comparator units, 22 and 26. Furthermore, an upper threshold value and a lower threshold value can be symmetrically classified to a starting state or a reference state of the first capacitor C1 and of the second capacitor C2, which preferably corresponds to half of a supply voltage V/2 (=½*supply voltage V). Signals 23, 25, 27, 29 are provided to a logic linkage unit 24, which executes an OR operation and generates the trigger pulse 15 as a result.

Figure 2:
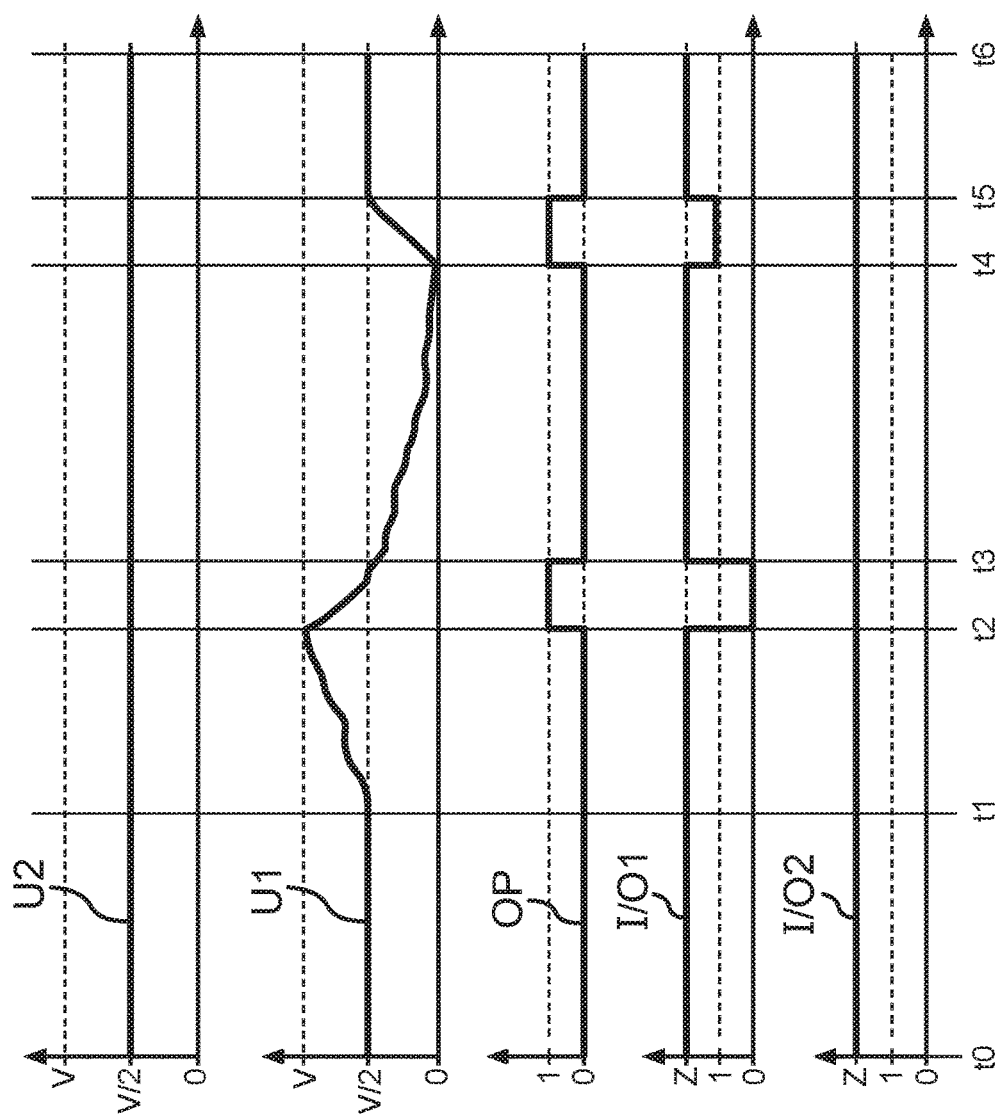
FIG. 2 shows a schematic representation of a time progression of characteristic signals of the monitoring device according to FIG. 1, assuming an ideal self-charging compensation.

FIG. 2 shows a compilation of five graphs, which are represented over a common time axis. Represented are the first voltage U1 at the first capacitor C1 (measuring capacitor), also characterized as the measurement voltage, as well as the second voltage U2 at the second capacitor C2 (reference capacitor), also characterized as the reference voltage. The first voltage U1 and the second voltage U2 may assume a value ranging between 0 and the value of the supply voltage V, which represents an operating voltage of the circuit. Furthermore, a binary operating state signal OP is represented, which characterizes an operating state of the data processing unit 12. With a low level 0, the data processing unit 12 is in a sleep mode, which is characterized by an especially low energy consumption of the data processing unit 12; with a high level 1, the data processing unit 12 is in an operating mode. A transition from sleep mode into operating mode takes place by means of the trigger pulse 15 provided to the input P1. A resetting from operating mode to sleep mode can take place by means of the data processing unit 12 itself, particularly by executing a corresponding program code.

Furthermore, the state of the first bidirectional connection terminal I/O1, which is connected to the first capacitor C1, and of the second bidirectional connection terminal I/O2, which is connected to the second capacitor C2, is represented in a graph, respectively. The three states may be present in this case, namely a high-resistance state Z, in which the first capacitor C1 or the second capacitor C2 remains uninfluenced, a high level 1, in which an electrically conductive connection is established to a supply potential, whereby a charging of capacitor C1 or C2, respectively, takes place. A low level 0 may be present as a further state, in which an electrically conductive connection is established to the reference potential 11, which leads to a discharging of the capacitor C1 or C2, respectively. In particular, there may be a provision that the high level 1 is represented physically by a voltage, which is equal to the supply voltage V.

With a starting state between a time t0 and t1, the second voltage U2 amounts to a constant V/2. In a similar manner, the first voltage U2 likewise amounts to V/2. The operating state signal OP in this case has the low level 0. Both bidirectional connection terminals, I/O1 and I/O2, are in a high-resistance state Z. A supply of current to capacitor C1 then takes place between point in time t1 and point in time t2 through a positive current signal 17. At point in time t2, the first voltage U1 reaches an upper threshold value, which was set to the value of the supply voltage V here for simplification purposes. Thus, a certain energy quantity or charge quantity flows between point in time t1 and point in time t2, which is characterized here as ΔEE. At point in time t2, thus the trigger pulse 15 is provided to the first input P1 of the data processing unit 12, whereby the operating state signal OP switches from the low level 0 to the high level 1. The data processing unit 12 then starts the processing of the status data and resets the first capacitor C1 back to its starting state, namely back to half of the supply voltage V/2 in which the bidirectional connection terminal I/O1 is set at the low level 0. Upon reaching half of the supply voltage V/2 by means of the first voltage U1, the first bidirectional connection terminal I/O1 is reset back to the high-resistance state Z, and the data processing unit 12 can return to sleep mode.

For example, a current flow of the current signal 17 then starts in the opposite direction at a point in time t3. The previously stored energy unit ΔEE or charge quantity is specifically hereby drained between point in time t3 and point in time t4. The first voltage U1 at the first capacitor C1 reaches a lower threshold, which was set to 0 for simplification purposes here, at a point in time t4. As previously in the interval between t2 and t3, a trigger pulse 15 at the first input P1 here starts the data processing unit 12 in order to process the status data. The single difference with respect to the process in interval t2, t3 is the first bidirectional connection terminal I/O1 is then switched to the high level 1, in which a connection exists with the supply voltage V. Once the first voltage U1 at the first capacitor C1 has reached the value of half of the supply voltage V/2, then the original state as found in interval t0, t1 is then present.

Figure 3:
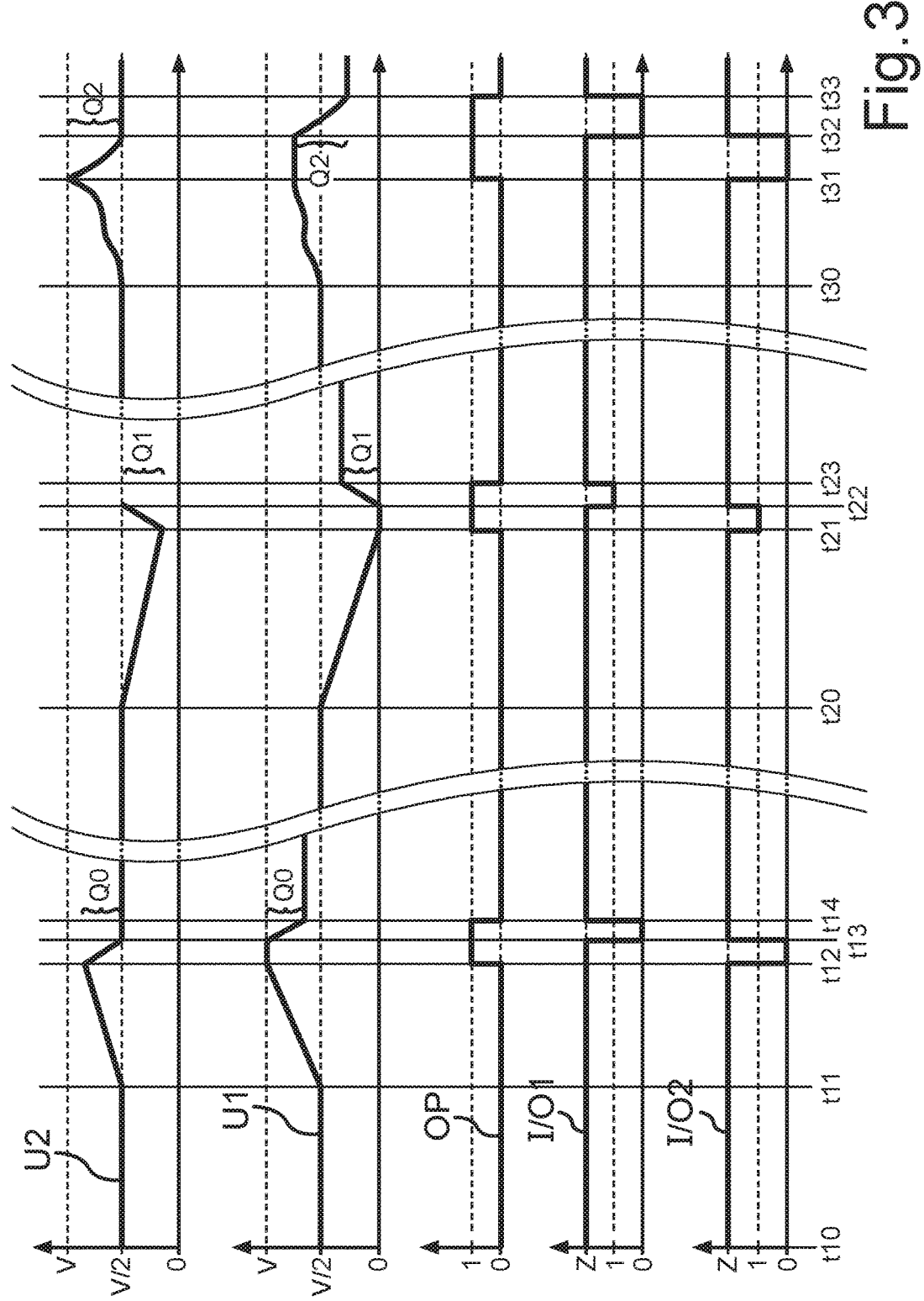
FIG. 3 shows a schematic representation of a time progression of characteristic signals of the monitoring device according to FIG. 1, assuming a non-ideal self-charging compensation.

FIG. 3 shows the same compilation of graphs, in which now a superimposed drifting apart of the two capacitors, C1 and C2, is also represented. Starting from a starting state, which is between a point in time t10 and a point in time t11, a supply of an energy unit ΔEE again starts at point in time t11. It is now assumed here that a uniform voltage drift takes place in this interval with the two capacitors, C1 and C2, that is the measuring capacitor and the reference capacitor. The first voltage at the first capacitor C1 reaches an upper threshold value at a point in time t12. The logic linkage unit 24 then generates the trigger pulse 15, which is provided to the first input P1 of the data processing unit 12. The data processing unit 12 then determines, by means of the second analog input ADC2, that the second capacitor C2, i.e. the reference capacitor, is no longer at half of the supply voltage V/2. As a result of this, there is no status data processing or storage. In the time interval between t12 and t13, a discharging of the second capacitor C2 then takes place to the target value, namely half of the supply voltage V/2. The first charge quantity drained from the second capacitor C2 for this is characterized as Q0. The equivalent charge quantity Q0 is subsequently also drained from the first capacitor C1 at an interval between t13 and t14. The corresponding states of the bidirectional connection terminals I/O1 and I/O2 are correspondingly low level 0 in the respective interval or otherwise a high-resistance state Z.

In the same manner, a starting state with respectively half of the supply voltage V/2 is present in a further progression between point in time t20 and t21 as a first voltage at the first capacitor and second voltage at the second capacitor. Current drain in the opposite direction then takes place. A requirement here is also that a superimposition of a drift current results in interval t21 and t22, which leads to a progressive discharging of the first capacitor C1 and of the second capacitor C2, which is not covered by the constant current source 18. At point in time t22, the first voltage U1 at the first capacitor C1 reaches the lower threshold value, whereby the trigger pulse 15 is generated, which is provided to the input P1. There is no storage of status data here either, because the second voltage U2 at the second capacitor C2 deviates from the target value of half the supply voltage V/2. Initially, in the time interval t22 to t23, the second voltage U2 at the second capacitor is reset to the target value of half the supply voltage V/2. A second charge quantity Q1 determined here is accordingly also reset back to that of the first capacitor C1. The state of the first bidirectional connection terminal I/O1 in this case is provided by the high level 1 between point in time t23 and t24; the state of the second bidirectional connection terminal I/O2 is provided by the high level 1 between point in time t22 and t23. Otherwise, the high-resistance state Z is present in this section with both bidirectional connection terminals I/O1 and I/O2.

A further superimposed process comprising current drain and drift takes place between a point in time t30 and t31, in which, contrary to the previous cases, a first exceeding of the threshold value takes place here through the second voltage U2 of the second capacitor C2, i.e. of the reference capacitor. In this case as well, no data storage takes place through the data processing unit 12, because the voltage at the second capacitor C2 here does not correspond to the target value of half the supply voltage V/2. In interval t22 to t23, the voltage U2 at the second capacitor C2 is reset to the target value of half the supply voltage V/2. Furthermore, a third charge quantity Q2 in this case is also drained from the first capacitor C1 in interval t23 to t33.

In particular, the phases in which the data processing unit 12 is active, for example between points in time t12 and t14 or points in time t31 and t33, may be very short, for example 200 ns. Reference is made at this juncture to the fact that the times are not being applied to scale. In particular, a time interval t11 to t12 can extend, for example, over a long timeframe, particularly of hours, days, or even weeks. This is particularly the case, for example, when a battery cell is being used with such type of monitoring device in a motor vehicle, which is shut off over a longer period of time.

Figure 4:
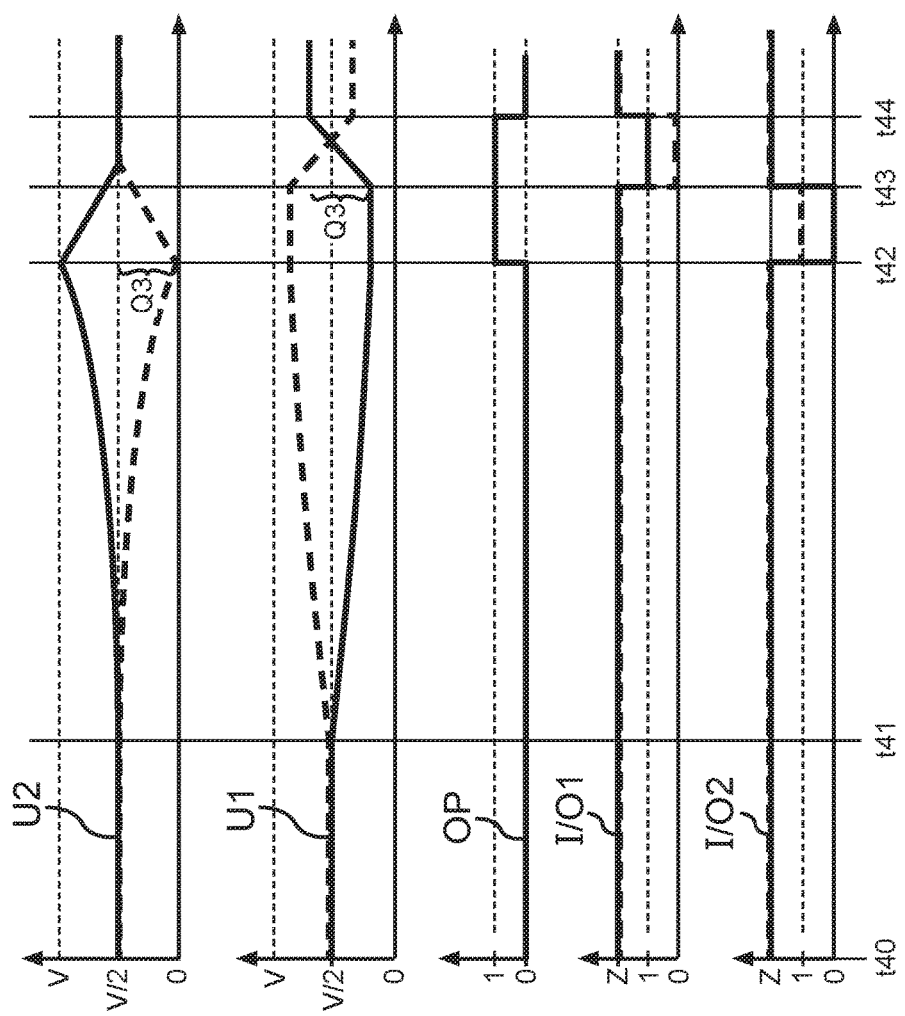
FIG. 4 shows a schematic representation of a time progression of characteristic signals of the monitoring device according to FIG. 1, assuming an uneven self-charging compensation with current drifting apart of a measurement signal and a reference signal.

FIG. 4 shows a case of long-term drift, in which the two capacitors, C1 and C2, have self-discharging that is of differing level. In particular, one of the two capacitors C1, C2 receives a higher compensating current than is necessary and the other receives a lower compensating current than is necessary. As a result of this, the two voltages, U1 and U2, drift apart from one another deviating from the target value of half the supply voltage V/2. In doing so, the first voltage U1 achieves an upper threshold value at the point in time t42, as a result of which a trigger pulse 15 is generated. The data processing unit 12 recognizes, by means of the deviating second voltage U2 at the second capacitor C2, that no storage is taking place. Such non-uniform self-discharging can result, for example, due to temperature influences or the like. The non-adapted compensating current distribution at the two capacitors, C1 and C2, is then corrected to the extent that a fourth charge quantity Q3 drained from the second capacitor is then supplied to the first capacitor C1 with opposite polarity.

The exemplary embodiment only serves to explain the invention and is not limited to this. In particular, the previously explained circuitry arrangement can be modified as desired, without extending beyond the scope of the invention.

Thus, it has been shown how the monitoring of status information of energy storage units, particularly battery cells, without a time basis, particularly based on energy units, can take place in a very energy-saving manner.

The invention claimed is:

1. A battery cell with a monitoring device, comprising:
a data processing unit for processing state data of the battery cell as a function of a trigger pulse,
a triggering unit, which is connected to the data processing unit, for generating the trigger pulse, and provision of the trigger pulse to the data processing unit,
wherein the triggering unit is designed to evaluate a measurement signal, which comes from the battery cell and correlates with an electrical energy of the battery cell, and to generate the trigger pulse as a function of the measurement signal,
wherein the triggering unit is designed to generate the trigger pulse at a first point in time, at which the battery cell has a first electrical energy content and to generate the trigger pulse at a second point in time, at which the battery cell has a second electrical energy content, wherein the first electrical energy content and the second electrical energy content differ by a pre-definable energy value, and
wherein the measurement signal is proportional to an electric current through the battery cell or proportional to an electrical power of the battery cell, wherein the triggering unit has means to generate an integration signal as a function of the measurement signal and when the integration signal falls below or exceeds a pre-definable threshold value, is designed to generate the trigger pulse and to reset the integration signal to a start value.

2. The battery cell according to claim 1, wherein the triggering unit has a first capacitor, which is electrically connected to a first analog input of the data processing unit as well as to a first comparator unit for generating the integration signal, wherein the integration signal can be provided to the first capacitor by a first electric voltage and the comparator unit is designed to generate the trigger pulse upon the exceeding of a pre-definable first threshold value by the first electric voltage at the first capacitor.

3. The battery cell according to claim 2, wherein the first capacitor is electrically connected to a first bidirectional connection terminal (of the data processing unit by way of a first resistor, wherein the first bidirectional connection terminal is designed to take on one of the three following states:
low level with an electrically conductive connection to a reference potential of the data processing unit, high level with an electrically conductive connection to a supply potential of the data processing unit, wherein a supply voltage of the data processing unit is present between the supply potential and the reference potential, or nonexistence of a conductive connection.

4. The battery cell according to claim 2, wherein the triggering unit has a second capacitor, which is electrically connected to a second bidirectional connection terminal of the data processing unit by a second resistor and is electrically connected to a second analog input of the data processing unit as well as to a second comparator unit, wherein a reference signal can be provided by a second electric voltage at the second capacitor, and the comparator unit is designed to generate the trigger pulse upon the exceeding of a pre-definable second threshold value by the second electric voltage, wherein the triggering unit has a common current source with a pre-definable constant current, which is designed to impose a compensating current in the first capacitor and in the second capacitor to compensate for self-discharging currents of the first capacitor and of the second capacitor.

5. The battery cell according to claim 4, wherein the triggering unit is designed to reset the second electric voltage to a reference state and to feed an equalization charge quantity to be introduced into the second capacitor also into the first capacitor when the pre-definable second threshold value is exceeded by the second electric voltage.

* * * * *